Sept. 6, 1966

P. P. HOWRILKA 3,271,626

PRINTED CIRCUIT CARD RACK

Filed Dec. 31, 1964

2 Sheets-Sheet 1

INVENTOR
PATRICK P. HOWRILKA

BY Sughrue, Rothwell, Mion, Zinn & Macpeak
ATTORNEYS

INVENTOR
PATRICK P. HOWRILKA

BY Seghers, Rothwell, Mion, Zinn & Macpeak
ATTORNEYS

United States Patent Office 3,271,626

Patented Sept. 6, 1966

3,271,626

PRINTED CIRCUIT CARD RACK

Patrick P. Howrilka, 521 Lowell Drive, Endwell, N.Y.

Filed Dec. 31, 1964, Ser. No. 422,791

9 Claims. (Cl. 317—101)

This invention relates to a rack for housing printed circuit cards or the like and more particularly to a highly simplified and inexpensive rack adapted to receive printed circuit cards of varying thickness and width without requiring major modification of the rack or its associated card connectors.

The advent of the printed circuit card, which may have coupled thereto complex electronic subassemblies, has provided an easy and relatively low cost method of manufacture of electronic equipment while facilitating repair due to electrical faults within the circuits or the elements making up the electronic subassemblies. Prior to the general use of the printed circuit techniques, it was necessary to first locate the faulty piece of equipment or circuit connection, and secondly to replace the component or recomplete the electrical circuit. Today, in equipment employing multiple printed circuit cards, this obvious time-consuming process has been eliminated. Each printed circuit card may be easily mechanically inserted and frictionally held in position within a rack or other support whereby appropriate electrical connections are made merely by the act of mechanical insertion.

In this respect, present racks or card holders for housing the printed circuit cards have been constructed of metal and/or plastic, the metal forming the major support portion while the plastic acts as the nonconductive contact area between the printed circuit card and the rack. The racks are either modular in form, that is, a separate plastic subassembly may be provided for each card, including the card support, with the subassemblies stacked together, or in the alternative, longitudinally extending members in the form of base bars, etc., are provided in which a pair of separate card guides are inserted in spaced positions longitudinally of the bars for supporting associated cards. In either case, the modular subassemblies and/or the bars are held in place with respect to a pair of end supports by screws or like separate connectors which act to form a longitudinal assembly.

It is the principal feature of the present invention to provide an improved rack for housing printed circuit cards in which the need for individual card guides or separate printed circuit card modules is completely eliminated.

It is a further object of this invention to provide an improved rack or card holder for housing printed circuit cards in which the card spacing for all the cards held within the rack may be readily varied by substituting preformed, longitudinally extending spacers in a simple and expeditious manner.

It is a further object of this invention to provide an improved rack for housing printed circuit cards in which cards of varying thickness may be accommodated within the same rack without major rack modification.

It is a further object of this invention to provide an improved rack for housing printed circuit cards in which the need for screws or separate fasteners for holding the printed card spacers, to the rack bars, or the rack bars to the end pieces, is completely eliminated.

It is a further object of this invention to provide an improved rack for housing printed circuit cards in which the rack may be easily modified for receiving cards of differing width by merely relocating the position of the spacer-carrying bars with respect to the rack end pieces.

It is a further object of this invention to provide an improved, highly simplified rack for housing printed circuit cards whereby card connectors of varying length and terminal capacity may be readily used within the same rack.

It is a further object of this invention to provide an improved, highly simplified rack for housing printed circuit cards in which the variable length connector holders may be individually and readily inserted and removed and without requiring screws or like fasteners.

It is a further object of this invention to provide an improved rack for housing printed circuits in which the printed circuit card spacer may be formed of relatively thin, moldable plastic and in which the individual serrations within the longitudinally extending spacer member may be of different dimensions to receive different size cards and color-coded or numbered for ease of individual card location and insertion.

Further objects of this invention will be pointed out in the following detailed description and claims and illustrated in the accompanying drawings, which disclose, by way of example, the principle of this invention and the best modes which have been contemplated of applying that principle.

Figures 1, 3:
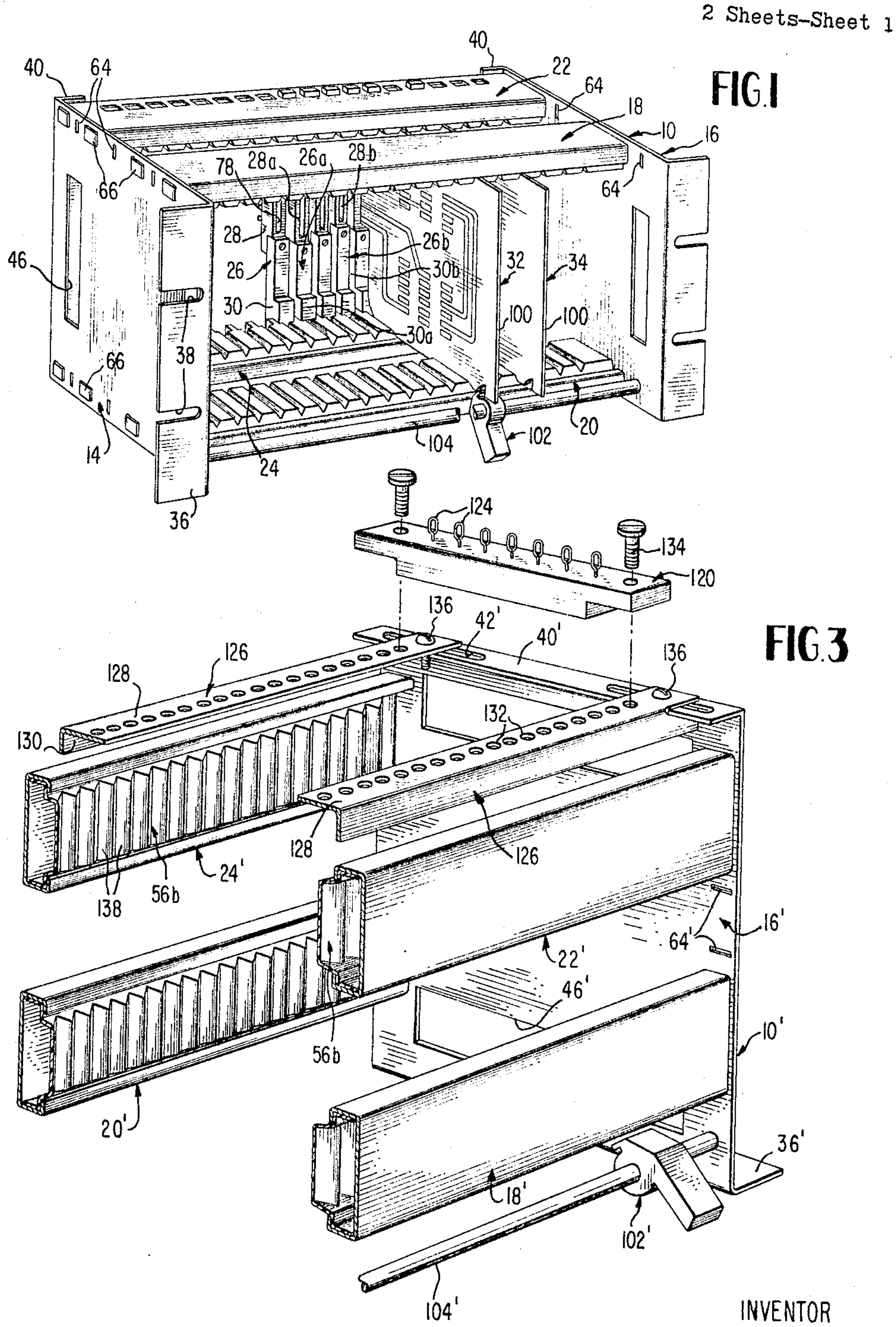
FIGURE 1 is a perspective view of one embodiment of the present invention showing the improved rack for housing printed circuit cards with two spaced cards positioned within the rack and coupled to respective card connectors.
FIGURE 3 is a perspective view, partially in section, of a second embodiment of the present invention.
Figures 2, 4, 5:
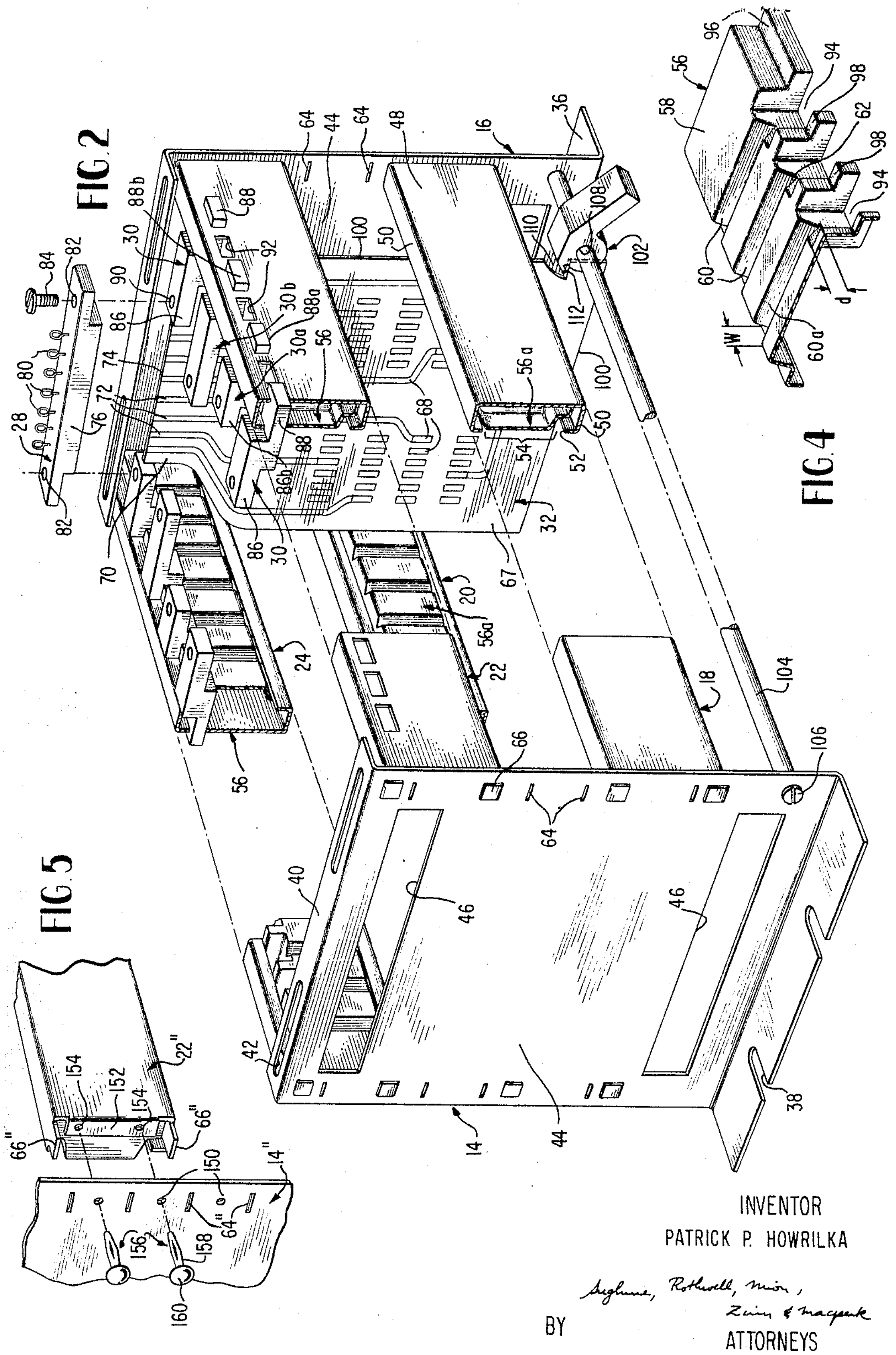
FIGURE 2 is another perspective view of the embodiment shown in FIGURE 1, partially exploded and partially in section, showing the method of attachment of the card, card connector and connector holders carried by opposed rack bars.
FIGURE 4 is a perspective view on one type of insertable spacer used in the apparatus of FIGURES 1 and 2.
FIGURE 5 is a perspective view of a portion of the rack shown in FIGURE 3 showing a modified type of connection between the channel-like bars and the rack end plates.

Referring to FIGURES 1 and 2 of the drawings, there is shown a preferred embodiment of the present invention. The rack or card holder 10 is of extremely simplified construction and formed of three principal components, a pair of spaced end members or plates 14 and 16, the end plates being coupled together solely through the use of four U-shaped channel members or bars 18, 20, 22 and 24. The third principal component is the series of printed circuit card connector assemblies each formed, as indicated, at 26, 26*a* and 26*b*. The card connector assemblies 26, 26*a* and 26*b* are so designated because the printed circuit card rack of the present invention advantageously provides means whereby card connectors of various lengths, carrying a different number of electrical terminals correlated to associated respective cards, may be readily and removably positioned on the card rack by means of correlated, connector holders of varying length. In the embodiment shown in FIGURES 1 and 2, the card connector assemblies 26*a* are provided with relatively long card connectors 28*a* and relatively short connector holders 30*a*, while the card connector assemblies 26*b* are provided with relatively short card connectors 28*b* and relatively long connector holders 30. Card connector assembly 26 has both card connector 28 and connector holders 30 of intermediate length.

The improved, simplified rack or card holder 10 of the present invention acts to house printed circuit cards of conventional construction and configuration. For instance, in FIGURE 1 there is shown a pair of spaced printed circuit cards 32 and 34 which are slid within the open end of the rack which, as shown, is positioned to provide a horizontally oriented opening for receiving a plurality of spaced printed circuit cards.

One important feature of the present improved printed circuit card rack is the manner in which the rack itself is assembled, requiring a minimum number of elements to effect a highly rigid and yet easily assembled and low-cost rack structure per se. In this respect, the four longitudinally extending bars 18, 20, 22 and 24 provide the physical connection between the spaced end sections 14 and 16 to form the rectangular rack. The end members 14 and 16 are formed of sheet metal bent to the desired configuration as are the bars. In this respect, the end members 14 and 16 include an outwardly directed flange 36, the edge of which may be provided with a pair of spaced slots 38 for receiving mounting screws (not shown) to allow the rack to be secured to a cabinet structure or other supporting means (not shown). At the opposite end of the plate member 14, an inwardly turned flange 40 may be provided which may or may not include a pair of spaced elongated slots 42, these slots being primarily used in the simplified, but non-flexible embodiment shown in FIGURE 3.

In addition, the main section 44 of the end plate includes a pair of spaced, relatively large, rectangular openings 46 which are primarily used for ventilating purposes allowing a coolant such as forced air to be circulated through and around the printed circuit cards during circuit energization. At the same time, the removal of the material to form the rectangular cutout acts to reduce the over-all weight of the rack without in any way compromising rigidity or strength.

As mentioned previously, the present rack acts to eliminate the use of conventional separate card guides or separate card modules including plastic supports along the sides of the cards. Instead, the improved card rack makes use of a number of longitudinally extending U-shaped bars of channel-like configuration formed from stamped metal with plastic, serrated spacer inserts. The bars may best be designated in the drawing as a front upper bar 18, a front lower bar 20, a rear upper bar 22, and a rear lower bar 24. Of course, this designation is only for a printed circuit card rack which is oriented horizontally, that is, positioned so that the individual cards 32, 34, etc., are slid horizontally into circuit connecting position as shown in FIGURE 1.

By reference to FIGURE 2, it is noted that the bars are generally U-shaped in configuration, that is, they include an outer flattened surface 48 extending the full length of the bar and includes integral ends 50 which terminate in a pair of opposed edges 52 forming an opening 54 therebetween. Thus, all of the bars are of channel configuration and act to receive individual, single element, molded plastic card spacers or guides 56.

The insertable spacer elements 56 and **56*a* are shown in FIGURE 4 and may be preferably molded by conventional plastic molding techniques which effect the production of a relatively thin, lightweight element having great structural rigidity when supported firmly by the respective channel members 18, 20, 22 and 24. The configuration for the spacer element 56 of FIGURE 4 for use in the embodiment of FIGURES 1 and 2, includes a flattened upper surface 58 forming hills interspersed by valleys which act to receive the edges of the card. The valleys are formed by the inclined surfaces 60 meeting at apex 62**. The depths of the valleys are equal in the configuration shown, however, the widths of the valleys indicated at "*w*" and the depth indicated by arrows "*d*" may be varied to allow printed circuit cards of greater thickness and/or depth to be slidably received by the spacer members 56 and **56*a* as may be desired. In any case, the indentations or serrations formed by the inclined surfaces merely act as guides for the insertable printed circuit cards and the card width may vary within limits, such as from 1/64 of an inch to 1/4 of an inch for the spacer shown without the need to change the spacer configuration. There is no need, for instance, for the card to be severely frictionally held within the spacer valleys, since the purpose of the valley is merely to orient the card with respect to the connector assembly. As mentioned previously, it may be desirable to color-code individual valleys such that the inclined surfaces which form a valley 60*a* adjacent those surfaces forming valley 60** may be of different color and thus, the person who manually inserts the printed circuit card may, at a glance, know which of the many spacer grooves or valleys is to receive a particular printed circuit card which is color-coded therewith.

The end plates 14 and 16 are coupled together to form the rack assembly in an operation which simultaneously locks the elongated spacer elements 56 and **56*a* within respective channel-like bars. Prior to assembly, an individual bar, such as bar 22, is open at the end to allow the elongated spacer member 56 to be slid longitudinally until it is fully inserted within the bar. It is to be noted that each of the end plates 14 and 16, respectively, includes a number of small, rectangular cutouts 64 positioned along a line extending from flange 36 to flange 40 along both edges of the plates. The rectangular cutout sections 64 receive respective tab members 66 of the bars 18 through 24, inclusive, the tabs 66 being bent over mechanically to securely lock the bars in position upon the end pieces 14 and 16 to form the main rack assembly, while simultaneously fixing the position of the single-element spacer 56 and 56*a* within its respective bar. It is to be noted that, in this simplified assembly method, the requirement for separate screws or fasteners to hold the end pieces in aligned position to form a rigid assembly is completely eliminated. As indicated in FIGURE 2, there are a number of rectangular openings 64 which are not used, the bars 18 through 24, inclusive, may be variably positioned with respect to the end plates 14 and 16** depending on the specific configuration of the printed circuit cards which are to be housed therein.

With the rack per se formed by the coupling of the end pieces through the use of the spaced bars, the present invention in its preferred form makes use of a simplified and changeable printed circuit card connection technique which allows interchangeability of card connectors for each of the printed circuit cards depending upon the number of circuits carried by the card at the terminal edge thereof. In this respect, it is noted that the printed circuit card 32 of FIGURE 2, which is formed of conventional construction, includes a nonconductive surface 67 and a plurality of conductive areas 68. The printed circuit card has a reduced terminal section 70 and a number of conductive terminal leads 72 imprinted thereon. For illustrative purposes, there are shown seven terminal leads which extend toward the card edge 74. For the particular card 32 shown, therefore, there is needed a printed circuit card connector assembly carrying seven spaced terminal members. This corresponds to printed circuit connector assembly 26 briefly referred to previously with respect to FIGURE 1. The circuit connector assembly 26 includes, therefore, a printed circuit connector 28 and a pair of spaced connector holders 30. Both the connector 28 and the holders 30 are formed of plastic or other insulative material. The connector 28 is T-shaped in configuration and includes a central, relatively thick section 76 including a longitudinally extending opening 78 (FIGURE 1) formed centrally thereof along the inner surface which acts to receive the terminal edge 74 of the printed circuit board 32. Conventional terminal members 80 are shown projecting from the outer surface of the printed circuit connector. The inner ends of the members 80 contact respective conductive surfaces 72 of the printed circuit board 32 and the electrical connections are made in a purely conventional manner. The exact method of connecting the conductive strip portions 72 to the individual conductors 80 forms no part of the present invention.

In order to physically locate the printed circuit connector with respect to the rack, and rigidly hold the same in position, the printed circuit connector 28 includes a pair of drilled holes 82 within the respective ends of the T-shaped element which act to receive conventional threaded screw members 84.

A second important part of this printed circuit connector assembly is the spaced insulated connector holders 30 whose configuration is best seen at the section line of FIGURE 2. The connector holders 30, 30*a* and 30*b* are of similar configuration approximating a "z" including an inwardly directed portion 86 and an outwardly directed offset portion 88. The inwardly directed portion 86 has an opening 90 drilled therein for receiving the inner end of screw member 84. Preferably, a helicoil (not shown) is positioned within the opening 90 so as to securely lock the connector 28 to the respective holders 30 with the screw members 84 fully seated. Prior to securing the printed circuit connectors to the connector holders, the connector holders are frictionally positioned by insertion within preformed openings formed within the walls of the rear bars 22 and 24 only. In this respect, rectangular openings 92 are formed at spaced positions along a line running longitudinally of the channel members 22 and 24. The rectangular openings 92 are of a configuration and size slightly in excess of the rectangular offset projections 88, 88*a* and 88*b* of respective connector holders 30, 30*a* and 30*b* which are shown positioned in sequence along the channel members 22 and 24 of the rack assembly of FIGURE 2.

In order to allow free insertion of the connector holders within the respective bars, in addition to the formation of the openings 92 within the bar members, the preformed plastic spacer 56 has its serrated card-receiving face also appropriately formed to include spaced opening 94 of sufficient dimension to allow the passage of the offset ends 88, 88*a* and 88*b* of the respective connector holders so that the terminal end will project through the respective opening 92 of the spacer-receiving members 22 and 24. It is noted that the formation of the openings 94 within the spacing member does not interfere with the provision of ledges 96 at the end of the spacer members and shortened ledge sections 98 intermediate of the openings 94. The ledges 96 and 98 act as contact surfaces during sliding insertion of the spacer members within the channel-like bars 22 and 24 and at the same time allow sufficient contact area between the spacer member and the bar to effectively provide a rigid support for the insertable printed circuit cards. It is to be noted that the spacer members 56*a* associated respectively with bars 18 and 20 do not include the formed openings 94 since, of course, the bars do not act to provide the additional function of securely locating and frictionally holding the printed circuit connector holders. Likewise, the bar members 18 and 20 do not include the spaced rectangular openings 92 of bars 22 and 24. In all other respects, both the inner and outer bars and the respective spacer members are identical in both configuration and dimension and may actually be interchangeably positioned, although the placement of a spacer member 56, for instance, within a front bar 18 or 20 would not allow the openings 94 formed therein to perform their function.

With reference to FIGURE 2, it is obvious that after printed circuit 32 is effectively positioned within the rack and suitable connection made between the printed circuit and the printed circuit connector assembly 26, a second card may be inserted adjacent thereto, being received by the next set of serrations formed within the individual spacers. However, in this case the electrical connection would be made to the printed circuit bar through the use of connector holders 30*b* positioned to the left thereof of connector holders 30. Since the connector holder 30*b* has an inwardly directed section 26*b* which is longer than section 26 of the adjacent connector holder 30, the printed circuit connector 28*b* associated therewith must necessarily include a lesser number of terminals and the printed circuit card (not shown) associated therewith must necessarily have a reduced number of terminal conductive circuit paths 72 if the paths are of the same dimension and spacing as in the illustrated printed circuit card 32.

By reference to FIGURE 1, it is noted that there are actually three different combinations of printed circuit card connectors including printed circuit card assemblies 26, 26*a* and 26*b*. It is obvious that for the shortest printed circuit card connector holder 30*a* the connector itself, 28*a*, will carry the greatest number of spaced terminal members and will be the longest. Further, the printed circuit connector assembly which includes the longest connector holders 30*b* will have the shortest card connector 28*b*, while the assembly including the intermediate size connector holders 30 will have a card connector 28 of intermediate length which, in this case, is shown as having seven terminals and selectively coupled to seven individual circuits carried by the printed circuit card board 32 (FIGURE 2). It is to be noted that all of the connector holders 30, 30*a* and 30*b* are merely physically positioned upon the rack by inserting the outer ends 88, 88*a* and 88*b* through respective openings 94 of the card spacer member 56 and the opening 92 formed within respective bars 22 and 24. In order to change a card size, such as from a seven-terminal card, as indicated at 32 to a card having more or less terminals, it is only necessary to physically slide the card connector holders inwardly until the ends 88, 88*a* or 88*b* are physically removed from their respective openings 94 and 92, whereupon new connector holders are inserted in their stead of a size corresponding to the replacement printed circuit card.

In order to aid in the physical removal of the printed circuit cards due to a faulty circuit or a faulty component carried by the board or in order to change the circuit, it is necessary to manually reach into the opening formed by the card rack as indicated in FIGURE 1, grasp the exposed edge 100 of the card and manually slide the card outwardly disconnecting the printed circuit card from its associated printed circuit connector and replace the card in the opposite manner to that of removal. In order to facilitate removal of the frictionally held card, the improved, simplified printed circuit rack of the present invention includes, in both embodiments, a pivotable, manually operated ejector member 102 which is slidably positioned on a longtudinally extending rod 104 which may be secured to the opposed end plates 14 and 16 by means of conventional screw members 106. The ejector member 102 includes an opening formed therein at 108 of a diameter slightly in excess of the rod so that the ejector may pivot about the rod axis and also slide longitudinally therealong. The printed circuit cards, such as cards 32 and 34 include a relieved or notched area 110, and the ejector member 102 has formed thereon a radial projection 112. Upon rotation of the ejector 92 about the rod axis, the projection 112 is moved into recess 110, and contacts the edge of the card formed by the recess and mechanically changes the rotary motion of the ejector to a longitudinal movement of the card to release the card from the printed circuit connector, to more easily allow the further manual removal of the card after it has been displaced longitudinally a slight distance. It is obvious that after card 32, for instance, is moved outwardly a slight distance by clockwise rotation of ejector 102, the ejector 102 may be moved longitudinally from left to right to a position where the projection 112 may enter the recess 110 of printed circuit card 34, whereupon a slight clockwise rotation of the ejector at this point will act to dislodge card 34 from its circuit-connecting position causing it to slide outwardly within the serrated spacers 56 and 56*a*.

Referring to FIGURE 3, there is shown a second embodiment of the present invention. In like manner to the previous embodiment, the printed circuit card rack is extremely simple in construction, employing relatively few parts, greatly reducing the cost of construction and in effect providing a rack which is extremely rigid but is both lightweight and subject to easy modification for receiving printed circuit cards of different dimensions. With respect to FIGURE 3, like parts to the embodiment of FIGURE 1 and FIGURE 2 have received similar numerical designations. Only end plate 16' is shown which includes outwardly directed flange 36' for mounting purposes and an inwardly directed flange 40' which includes the pair of spaced longitudinally extending slots 42'. Further, the end plate 16' includes the spaced, relatively large rectangular openings 46' and a series of much smaller rectangular slots 64' which are shown equally spaced along lines adjacent both edges. The slots 64' act to receive tabs of four equally formed U-shaped bars 18', 20', 22' and 24'. In this case, the upper rear and lower rear bars 22' and 24' do not include rectangular cutouts, such as the cutouts 92 formed on bars 22 and 24 of the first embodiment since, in this case, each of the bars receives an elongated, serrated plastic spacer member **56*b* which is similar to the spacer member 56*a* positioned within the bars 18 and 20 of the first embodiment. As in the first embodiment, the rack includes an elongated rod member 104' and a slidable and rotatable ejector member 102'**, for loosening and ejecting the card (not shown) a short distance prior to complete manual removal.

As mentioned previously, the inner flange 40' of the end plate 16', as well as the similarly formed end plate 14' (not shown) is provided with the elongated slots 42'. Unlike the first embodiment, this particular rack is not meant to be used with printed circuit connectors of varying length depending upon the number of circuits carried by the associated printed circuit board. Rather, each of the printed circuit connectors indicated at 120 will have identical longitudinal dimension and include a pair of spaced mounting holes of fixed widths. The printed circuit connector 120 in all other respects is conventional; that is, it may include a number of exposed terminal members 124 having ends (not shown) received within a longitudinal slot (not shown) which acts to receive the terminal end of a printed circuit board (not shown). In order to mount the printed circuit connector 120 on the rack, the rack of the present embodiment includes a pair of elongated, L-shaped formed metallic support members 126 including an outer flattened support surface 128 and a 90° flange surface 130 forming a rigid longitudinally extending element. Each of the connector-receiving surfaces 128 includes a plurality of longitudinally spaced openings 132 which receive the inner end of screw member 134 or other conventional connectors for physically locking the printed circuit connector members 120 to the support rack 10'.

In order to allow some flexibility with respect to the printed circuit cards and their connectors, the elongated slots 42' act to adjustably support the spaced connector support members 126 such that a pair of screw members 136 which couple the connector supports 126 may be loosened to allow the supports 126 to be moved toward or away from each other for receiving printed circuit card connectors 120 of greater or lesser length than the connector 120 shown. For instance, if all the printed circuit cards which may be used with the rack assembly 10' have only two or three terminal leads at the terminal end, it may be desired to use relatively short connectors 120 having perhaps only three or four terminals thereon and, in this case, the screws 136 would be loosened, the members 126 would be moved towards the center line of the end plates 14' and 16' (not shown), thus giving some adjustability to the second embodiment. Of course, this embodiment cannot be used in the same manner as that of the rack shown in FIGURES 1 and 2 to receive a group of printed circuit cards of a differing number of terminal leads and associated connectors of varying longitudinal dimension and a correlated number of terminals.

Reference to FIGURE 5 discloses an alternative arrangement for easily and effectively mechanically coupling the longitudinally extending channel-like bars to the spaced end plates to effect a rectangular rack configuration without the necessity of mechanically bending over the tabs of the bars after insertion within respective openings carried by the end plates. This type of mechanical connection employs the same openings 64'' formed within end plate 14'' such that the tab or tab extension received within these openings again allows selective positioning of the bars along the perforated edges of the end plates. In addition, there are provided intermediate of the uniformly spaced openings 64'' additional openings 150 which are circular rather than being rectangular. In addition, the bar, in this case 22'', includes an inwardly directed flange 152 which is formed integrally therewith and extends in the same plane as the base line of the tab extensions. A pair of spaced openings or holes 154 are formed within the flange, the position of these holes 154 coresponding to the position of the holes 150 formed within the end plates such that when the tabs 66'' pass through the tab receiving openings, the respective holes 150 and 154 are in alignment. There are shown conventional mechanical snap connectors 156 including rounded heads 160 and deformable bodies 158 whereupon the bodies compress slightly during insertion and thereafter return to the shape shown to securely lock the two elements in position to form a completed, mechanically rigid assembly. Of course, the same frictional snap connections are used for connecting the other bars 18'', 20'' and 24'' (not shown) to respective end plates.

It is obvious from viewing FIGURES 2 and 5 that various combinations may be provided for physically coupling the channel-like bars to the spaced end plates. For instance, the arrangement of FIGURE 5 may be modified by eliminating the rectangular openings 64'' on plate 14'' and eliminating the longitudinally projecting tabs 66'' of bar 22''. In this case, only a pair of snap connectors 156 act to position and couple the abutting members. In a most simplified system, a single snap connector 156 may be used which would thus pass through a single opening 150 in plate 14'' and aligned opening 154 of channel-like bar 22''. In such a case, the single opening 154 in the channel-like bar would probably be centered on flange 152. It is the intention, therefore, to cover any combination of rectangular openings in the plate, tabs on the bar and aligned openings in the plate and bar flange which would satisfy the need for structural rigidity. It is also obvious that many other fasteners may be employed other than the snap fastener shown at 156 in FIGURE 5. Alternatively, a quarter turn fastener, safety bolt and nut, rivet, blind hole rivet or screw (with tapped hole on flange 152) may be employed.

From the foregoing, it is apparent that the present invention in both forms completely eliminates the use of conventional card guides or separate modules which are characteristic of conventional printed circuit rack assemblies. It is further apparent that the card spacing is dependent purely upon the spacing of the serrations and may be as close as .001 of an inch. In this respect, the position and dimension of the slots 92, both the width and the longitudinal dimensions of the card connectors and the card connector support members or holders may be varied depending upon the relative spacing of the cards within the racks. In the alternative embodiment, the spacing of the holes 132 within the connector support members 126 and their spacing may be varied depending upon the spacing of the serrations formed by the inclined surfaces 138. Further, in the embodiment of FIGURES 1 and 2, portions of the flattened surface 56 and the inclined surfaces 60, **60*a*, etc., form flattened peaks between the valleys, whereas in the embodiment of FIGURE 3 no such flattened surfaces are utilized, merely a series of inclined surfaces 138** forming the fully serrated spacer surface. At the same time, while in both embodiments uniform dimensions are utilized throughout the length of the individual spacers, it is obvious that some of the valleys may be made deeper, and/or some of the flattened surface areas may be made relatively wide to provide variable spacing between respective printed circuit cards and at the same time the rack may be thus provided to receive printed circuit cards of varying width and/or thickness. Colored coding of the serrations within the spacer members and/or numbering ensures proper insertion of the associated color-coded printed circuit cards, thus preventing improper positioning of the printed circuit cards within the rack.

While conventional plastic and other insulative materials form the enlongated spacers and the printed circuit connectors and connector holders, and while the end plate and the connecting bars are formed of thin metal stock bent to the desired configuration, it is obvious that other materials may be readily substituted for those illustrated without departing from the scope of the invention.

While there have been shown and described and pointed out the fundamental novel features of the invention as applied to the preferred embodiments, it will be understood that various omissions and substitutions and changes in the form and detail of the devices illustrated and in their operation may be made by those skilled in the art without departing from the spirit of the invention. It is the intention, therefore, to be limited only as indicated by the scope of the following claims.

What is claimed is:

1. An improved rack assembly for housing printed circuit cards having terminal ends carrying spaced conductive terminal leads, said assembly comprising: a pair of spaced end plates, at least one pair of oppositely oriented bars positioned longitudinally between said end plates and affixed thereto, said bars being of channel-like configuration and having the channels directed inwardly toward each other, said channels extending longitudinally of said bars at right angles to said spaced end plates, molded, unitary card spacers carried by each channel-like bar, each of said card spacers being restrained by said bar against transverse movement but slidable longitudinally therein, each spacer extending substantially the entire length of its respective channel, said spacers further being provided with serrated surfaces which protrude from said channels with said serrations acting to receive and guide inserted printed circuit cards, card connectors and means for fixedly positioning said card connectors on said assembly with the terminal ends of said cards coupled to said connectors in circuit completing relationship.

2. The apparatus as claimed in claim 1 wherein said end plates include rows of spaced, aligned tab receiving openings formed along respective plate edges, and tabs formed at the end of said bars with said tabs extending through selected ones of said plate openings for adjustably locating said bars with respect to said plates.

3. The apparatus as claimed in claim 2 wherein said means for affixing said bars between said plates comprises bending said tabs at right angles against said plate sides after insertion through said tab receiving openings.

4. The apparatus as claimed in claim 3 wherein said end plates further include additional openings uniformly positioned intermediate of said tab receiving openings and in line therewith, said channel-like bars include terminal flanges directed inwardly at right angles to said tabs and in line with the inner ends of said tabs, at least one opening formed within each of said flanges, said flange opening being at a predetermined position with respect to said tabs so as to be in line with a selected opening within said plate and frictional snap engaging members inserted within said aligned openings for mechanically coupling said channel bars to said end plates.

5. The rack assembly as claimed in claim 1 for use with cards having a recess formed along one of said card edges, said assembly further including a rod, means for fixedly positioning said rod on said rack with the axis of said rod running parallel to said bars and spaced slightly from said cards, an ejector, means for pivotably and slidably positioning said ejector on said rod, and a radial projection formed on said ejector whereby said ejector may be slid longitudinally of said rod and rotated to cause said projection to enter said card recess to effect initial disengagement of said card from said connector to facilitate card removal.

6. The apparatus as claimed in claim 1 further including a pair of card connector holders for each card connector, each card connector holder being coupled at one end to a respective outer end of said card connector and means for insertably connecting the other end of each connector holder within respective spacer carrying bars whereby said bars act both to guide said inserted printed circuit card and to frictionally support said printed circuit card connectors.

7. The apparatus as claimed in claim 1 wherein the printed circuit cards have terminal ends of varying width and a related variable number of spaced, conductive terminal leads, and wherein said card connectors are of a length corresponding to the width of the terminal portion of said printed circuit card and include a complementary number of terminals to said card conductive terminal leads, a pair of card connector holders for each card connector, said card connector holders being of variable length and correlated to the length of said printed circuit card connectors whereby each connector and connector holder assembly has the same over-all length regardless of the length of the individual connector.

8. The apparatus as claimed in claim 7 wherein said opposed pair of connector holders are of identical Z-shaped configuration and size and include an inwardly projecting end and an offset, outwardly projecting end and said associated spacer receiving rack bars include a longitudinally extending line of uniformly spaced and sized openings, said openings acting to receive the ends of said connector holders remote from said card connector whereby said card connector assembly is frictionally held by said rack bars.

9. The apparatus as claimed in claim 8 wherein said insertable, molded spacer includes aligned openings, said openings acting to also receive the end of said connector holders which are inserted within an associated bar opening to further aid in frictionally holding these members after insertion.

References Cited by the Examiner

UNITED STATES PATENTS

| | | | |
|---|---|---|---|
| 2,915,680 | 12/1959 | Kong | 317—101 |
| 3,026,453 | 3/1962 | Marks | 317—101 |

FOREIGN PATENTS

| | | |
|---|---|---|
| 676,346 | 12/1963 | Canada. |

ROBERT K. SCHAEFER, *Primary Examiner.*

W. C. GARVERT, *Assistant Examiner.*